United States Patent [19]

Shichi et al.

[11] Patent Number: 5,012,109
[45] Date of Patent: Apr. 30, 1991

[54] CHARGED PARTICLE BEAM APPARATUS

[75] Inventors: Hiroyasu Shichi, Koganei; Setsuo Nomura, Tokyo; Eisuke Mitani, Tokorozawa, all of Japan

[73] Assignee: Hitachi, Ltd., Tokyo, Japan

[21] Appl. No.: 378,286

[22] Filed: Jul. 11, 1989

[30] Foreign Application Priority Data

Jul. 15, 1988 [JP] Japan ................................. 63-175024

[51] Int. Cl.[5] ........................................ H01J 37/256
[52] U.S. Cl. ................................. 250/491.1; 250/306; 250/307; 250/309; 250/310; 250/492.1; 250/492.2; 250/492.3; 250/396 R
[58] Field of Search ..................... 250/491.1, 309, 310, 250/306, 307, 305, 492.1, 492.2, 492.3, 396 R

[56] References Cited

U.S. PATENT DOCUMENTS

| | | | |
|---|---|---|---|
| 4,334,139 | 6/1982 | Wittekoek et al. | 250/491.1 |
| 4,437,012 | 3/1984 | Cavy et al. | 250/491.1 |
| 4,451,738 | 5/1984 | Smith | 250/491.1 |
| 4,562,352 | 12/1985 | Shiokawa | 250/310 |
| 4,694,170 | 9/1987 | Slodzian et al. | 250/310 |
| 4,740,698 | 4/1988 | Tamura et al. | 250/309 |
| 4,841,143 | 6/1989 | Tamura et al. | 250/306 |

*Primary Examiner*—Jack I. Berman
*Assistant Examiner*—Kiet T. Nguyen
*Attorney, Agent, or Firm*—Antonelli, Terry, Stout & Kraus

[57] ABSTRACT

A charged particle beam apparatus comprising a charged particle beam source(s) for generating an ion beam and an electron beam, a focusing lens system for finely focusing each of the generated ion beam and electron beam, a charged particle beam deflecting system for deflecting each of the focused ion beam and electron beam, and a specimen subjected to irradiation thereof with each of the focused ion beam and electron beam is provided with means for detecting the deviation of the irradiation positions of the ion beam and the electron beam on the specimen from each other and means for making the irradiation positions of the ion beam and the electron beam on the specimen coincident with each other on the basis of the result of detection of the deviation of the irradiation positions from each other.

5 Claims, 1 Drawing Sheet

CHARGED PARTICLE BEAM APPARATUS

BACKGROUND OF THE INVENTION

The present invention relates to a charged particle beam apparatus suitable for use as a micro fabrication (or processing) apparatus or a micro surface area analysis equipment using charged particle beams.

In techniques for processing or analysis of a micro area using an ion microprobe, it is indispensable to observe an image of a specimen surface for the purpose of determining a position on the specimen to be analyzed, etc. Conventionally, an optical microscope has been used as a tool for observing the image of the specimen surface. In recent years, however, in order to make it possible to observe even a micro or fine structure of a specimen surface which cannot be observed by the optical microscope, a method of observing the specimen surface by means of a finely focused electron beam has been proposed for an apparatus in which the micro area is processed or analyzed by use of the ion microprobe. In such a method, a charged particle source, a focusing lens and a deflector which form the ion microscope, are also used for forming an electron beam. Namely, since ions having positive charges and electrons having negative charges can take the same trajectory in principle by inverting the polarities of electric signals supplied to a source for generation of the ions and electrons (charged particle source), an electrostatic focusing lens, etc., the observation of an image of the specimen surface using the finely focused electron beam makes it possible to observe the specimen surface image as a scanning electron microscopy image having a resolution which is remarkably high as compared with the conventional method using the optical microscope. This type of apparatus is described in JP-B-51-5315.

By the prior art shown in the above-mentioned reference, it is possible to observe an image of a specimen surface with a high resolution. In practice, however, when one tries to direct an ion beam onto a desired point on the specimen surface after the specimen surface image has been observed by means of an electron beam, it is difficult to form the ion beam spot onto the desired point on the specimen surface even if the polarities of the electric signals supplied to the charged particle source and the focusing lens system are inverted. The causes of this difficulty include the deflection of the electron beam induced by leakage magnetic fields from various power supplies and the miss alignment of the optical axis of the lens system.

SUMMARY OF THE INVENTION

An object of the present invention directed to a charged particle beam apparatus in which a means for observation of a specimen surface using an electron beam is added to an apparatus for analyzing or processing the specimen surface by use of an ion beam, so as to make the irradiation positions of the ion beam and the electron beam on the specimen coincident with each other, thereby allowing to perform, the highly precise positioning of a location on the specimen surface to be analyzed or processed, by means of the electron beam.

The above object can be achieved by constructing a charged particle beam deflecting system so that the deviation of an irradiation spot position on a specimen surface upon irradiation with an ion beam and an irradiation spot position on the specimen surface upon irradiation with an electron beam from each other is confirmed and a deflection signal applied to a deflector of the charged particle beam deflecting system can be changed upon irradiation with the ion beam and upon irradiation with the electron beam so that the amount of deviation of the irradiation positions from each other becomes zero. Therefore, in a charged particle beam apparatus according to the present invention, a marker capable of arbitrarily moving on a CRT for observation of an image of the specimen surface is provided and different deflection signals are interchangeably applied to the charged particle deflecting system upon irradiation with the ion beam and upon irradiation with the electron beam.

The change-over of the deflection signal can be automatically made linked or interlocking with the change-over of a charged particle source(s) which is made on irradiation with the ion beam and upon irradiation with the electron beam.

The charged particle beam deflection system with the above-mentioned construction according to the present invention allows to make the irradiation positions of the ion beam and the electron beam on the specimen coincident with each other.

More particularly, the deviation of the irradiation positions of the ion beam and the electron beam on the specimen from each other can be observed in such a manner that an image formed by secondary charged particles emitted from the specimen upon irradiation thereof with the ion beam and an image formed by secondary charged particles emitted from the specimen upon irradiation thereof with the electron beam are comparatively observed on the specimen surface image observing CRT. Next, any characteristic point in the image of secondary charged particle images can be marked by means of the marker capable of arbitrarily moving on the specimen surface image observing CRT. Thereafter, DC deflection voltage components having different values are applied upon irradiation with the ion beam and upon irradiation with the electron beam and the values of the DC deflection voltage components are adjusted so that the characteristic points in the two secondary charged particle images coincide with each other. As a result, it is possible to make the irradiation points of the ion beam and the electron beam on the specimen coincident with each other.

If the values of the DC deflection voltages necessary for making the irradiation positions of the ion beam and the electron beam on the specimen coincident with each other have been thus determined, the subsequent change-over between the ion beam irradiation and the electron beam irradiation may be carried out by merely changing over a deflection voltage source interlocking with the change-over of a single electron beam and ion beam source of separate electron beam and ion beam sources with the DC deflection voltage components fixed to the determined values.

DESCRIPTION OF THE PREFERRED EMBODIMENTS

An embodiment of the present invention will now be explained by virtue of FIGS. 1 and 2.

Figure 1:
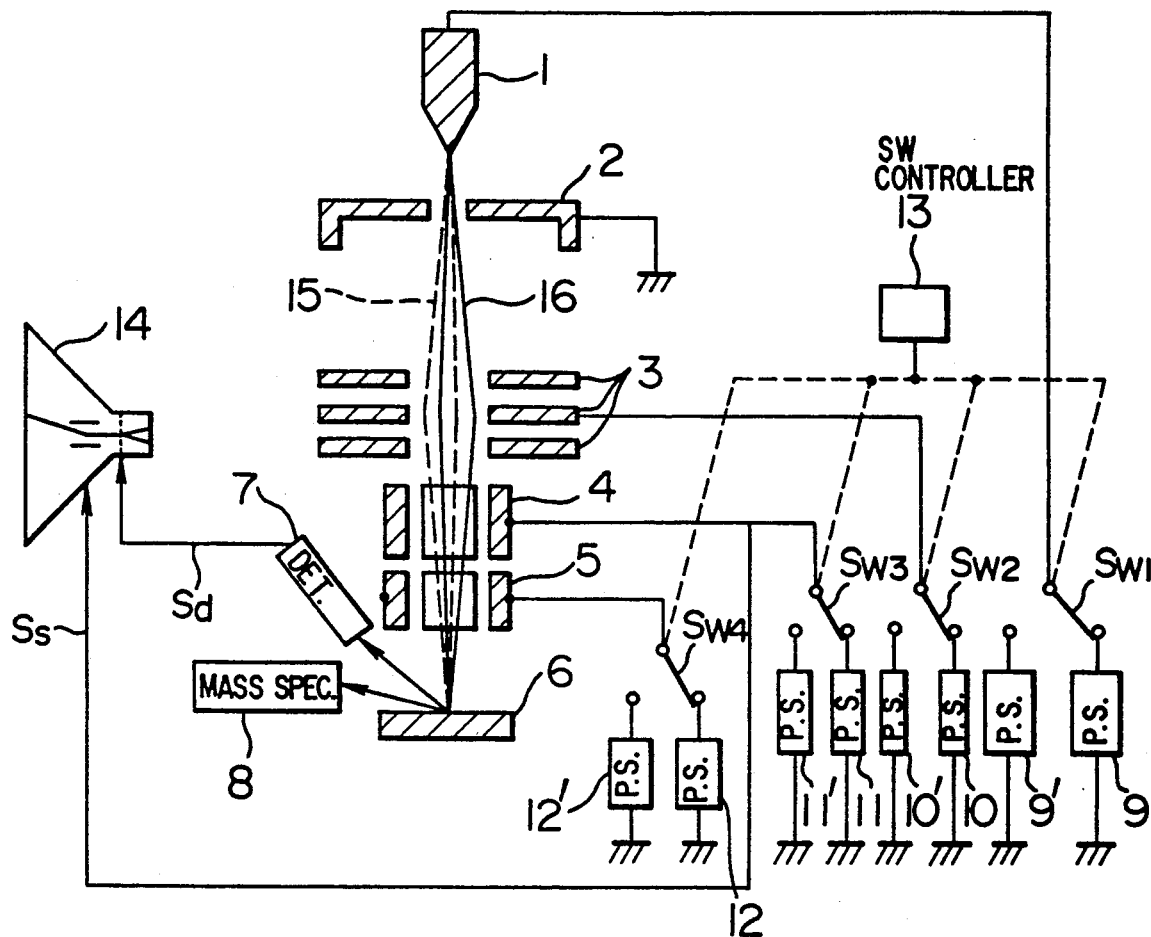
FIG. 1 is a view showing the overall construction of a charged particle beam apparatus according to an embodiment of the present invention.
Figure 2A:
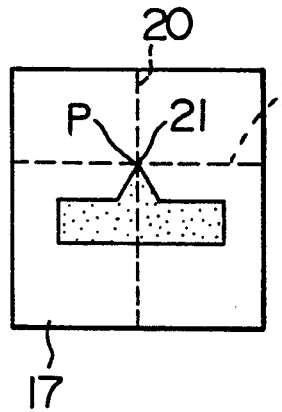
FIGS. 2a to 2c are view schematically showing secondary electron images on a CRT, FIG. 2a showing the secondary electron image obtained by scanning a specimen by means of an electron beam, FIG. 2b showing the secondary electron image obtained when the specimen is scanned by an ion beam and FIG. 2c showing the secondary electron image obtained when the specimen is moved to scan the vicinity of a position on the specimen to be analyzed by an electron beam.
Figure 2B:
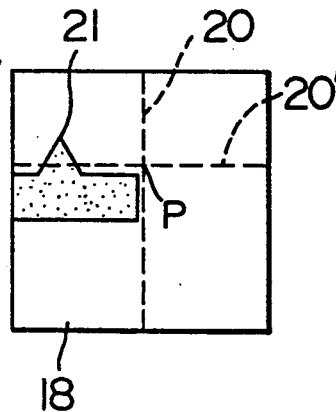
Figure 2C:
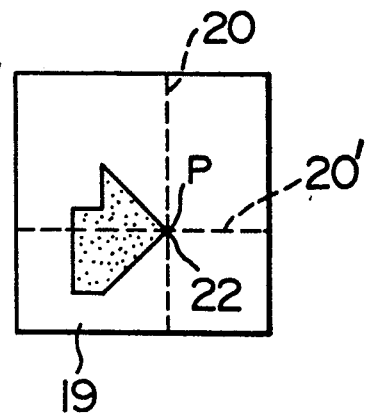

In FIG. 1, reference numeral 1 designates a charged particle beam source for generating an ion beam and an electron beam, numeral 2 a charged particle beam extracting electrode, numeral 3 a charged particle beam focusing lens, numeral 4 a deflection electrode for scan of the charged particle beam, numeral 5 a deflection electrode for making the irradiation positions of the ion beam and the electron beam on a specimen coincident with each other, numeral 6 the specimen, numeral 7 a secondary electron detector, numeral 8 a secondary ion mass spectrometer, numerals 9 and 9' power supplies for accelerating the charged particle beam, numerals 10 and 10' power supplies for the charged particle beam focusing lens 3, numerals 11 and 11' power supplies for deflecting the charged particles for scan thereof, numerals 12 and 12' power supplies for deflecting the charged particles to make the irradiation positions of the ion beam and the electron beam on the specimen 6 coincident with each other, numeral 13 a switch change-over controller for changing over switches $Sw_1$, $Sw_2$, $Sw_3$ and $Sw_4$ linked or interlocking with each other upon irradiation of the electron beam and upon irradiation of the ion beam, numeral 14 a CRT (cathode-ray tube), numeral 15 the ion beam, and numeral 16 the electron beam. Reference numeral 17 shown in FIG. 2a designates a secondary electron image of the specimen surface (by irradiation with electron beam) which is obtained by scanning any region on the specimen 6 (a region including a characteristic structure) by the electron beam 16 (or a specimen surface image obtained in such a manner that secondary electrons generated from the specimen 6 by the scan of the specimen 6 by the electron beam 16 are detected by the secondary electron detector 7 and the detection signal is depicted as a brightness modulation signal of the CRT 14). Numeral 18 shown in FIG. 2b designates a secondary electron image of the specimen surface (by irradiation with ion beam) which is obtained by scanning the specimen 6 by the ion beam 15. Numeral 19 shown in FIG. 2c designates a secondary electron image of the specimen surface (by irradiation with electron beam) which is obtained by moving the specimen 6 and scanning the vicinity of a position on the specimen to be analyzed by the electron beam 16. In FIGS. 2a to 2c, numeral 20 and 20' designate cursors on the CRT, numeral 21 a characteristic point, and numeral 22 the position to be analyzed.

In operation, when a negative DC voltage from the charged particle beam accelerating power supply 9 is applied to the charged particle beam source 1, an electron beam 16 can be extracted from the charged particle beam source 1. The extracted electron beam 16 is focused onto the specimen 6 by the charged particle beam focusing lens 3. The focused electron beam 16 is two-dimensionally scanned on the specimen 6 in X and Y directions by the charged particle beam scanning deflection electrode 4. (In FIG. 1, the illustration concerning the Y direction is omitted.) At the same time, secondary electrons emitted from the specimen 6 are detected by the secondary electron detector 7. A detection signal $S_d$ from the secondary electron detector 7 and a scanning signal $S_s$ from the power supply 11 for deflection of charged particle beam for scan thereof are simultaneously inputted to the CRT 14 so that a secondary electron image of the specimen surface by irradiation with electron beam (or the image 17 shown in FIG. 2a) is obtained on the CRT 14. The characteristic point 21 in the secondary electron image 17 obtained on the CRT 14 is marked by virtue of the intersection of the cursors 20 and 20' which are in the X and Y directions. Next, the switch change-over controller 13 is operated to change over the connection of the switch $S_{W1}$ so that a positive DC voltage from the charged particle beam accelerating power supply 9' is applied to the charged particle beam source 1. (The output voltage of the accelerating power supply 9' has a polarity reverse to the polarity of the output voltage of the accelerating power supply 9 and the absolute value of each output voltage can be arbitrarily set in accordance with the purpose.) Thereby, an ion beam 15 can be extracted from the charged particle beam source 1. In a similar manner to the case of the above-mentioned irradiation with electron beam, a secondary electron image of the specimen surface by irradiation with ion beam (or the image 18 shown in FIG. 2b) is obtained on the CRT 14. In this case, it is required that the power supply for the charged particle beam focusing lens 3 is changed over to the ion beam focusing lens power supply 10' side by the interlocking switch $S_{W2}$ and the power supply for deflection of charged particle beam for scan thereof is changed over by the interlocking switch $S_{W3}$ to the ion beam deflection power supply 11' side where an output deflection voltage is inverted and the value thereof is adjusted so that the display magnification of the secondary electron image 18 coincides with that of the secondary electron image 17. However, since the irradiation positions of the ion beam 15 and the electron beam 16 on the specimen may deviate from each other for the reason which has been mentioned before, an imaging area of the secondary electron image 17 by irradiation with electron beam and an imaging area of the secondary electron image 18 by irradiation with ion beam may deviate from each other. Therefore, in the present invention, adjustment as mentioned just below is made. Namely, upon irradiation with ion beam, the power supply for deflection of charged particle beam for making the irradiation position of ion beam and the irradiation position of electron beam coincident with each other is in a condition changed over to the deflection power supply 12' side for use upon irradiation with ion beam by the switch $S_{W4}$. When the set voltage values of the deflection power supply 12' for the X and Y directions are changed (the illustration concerning the Y direction is omitted from the drawing), the imaging area of the secondary electron image 18 is correspondingly moved. The voltage values of the deflection power supply 12' are adjusted until the characteristic point 21 in the secondary electron image 18 by irradiation with ion beam overlaps the position P in the secondary electron image 17 by irradiation with electron beam having been marked by virtue of the cursors 20 and 20'. With this adjustment, the imaging areas of the two secondary electron images 17 and 18 completely overlap each other. In order to obtain a secondary electron image by irradiation with the electron beam 16 again, the switches $S_{W1}$, $S_{W2}$, $S_{W3}$ and $S_{W4}$ are returned to their original conditions (or the conditions shown in FIG. 1) by the switch change-over controller 13 so that the charged particle beam accelerating power supply is changed over to the electron beam accelerating power supply 9 side to invert the polarity of the acceleration voltage while the power supply for the charged particle beam focusing lens, the power supply for deflection of charged particle beam for scan thereof, and the power supply for deflection for making the irradiation positions of ion beam and electron beam coincident with each other are changed over to their original conditions in an interlocking manner. In this manner, the change-over of the power supplies upon irradiation with ion beam and upon irradiation with electron beam is effected by changing over the switches $S_{W1}$, $S_{W2}$, $S_{W3}$ and $S_{W4}$ through the switch change-over controller 13 in an interlocking manner.

Next, explanation will be made of an example in which the method of irradiation with charged particle according to the present invention is applied to a secondary ion mass spectrometry.

First, the irradiation positions of the ion beam 15 and the electron beam 16 on the specimen are made coincident with each other by the above-mentioned method. Next, the vicinity of a position on the specimen to be analyzed is irradiated with the electron beam 16 while being scanned by the electron beam 16, thereby to obtain a secondary electron image by irradiation with electron beam (or the image 19 shown in FIG. 2c). The cursors 20 and 20' are moved on the CRT 14 that the intersection P thereof coincides with the position 22 to be analyzed in the secondary electron image 19. The cursors 20 and 20' are interlocked with the power supplies 11 and 11' for deflection of charged particle beam for scan thereof and have a function of stopping the irradiation spot of a charged particle beam at the position 22 to be analyzed on the specimen corresponding to the intersection P of the cursors 20 and 20' when the beam scan is stopped. Accordingly, in the case where the charged particle beam apparatus is thereafter turned to a mode of irradiation with ion beam, the position 22 to be analyzed in the secondary electron image 19 designated by the intersection P of the cursors will be irradiated with the ion beam 15. At the same time, secondary ions emitted from the specimen 6 are detected by the secondary ion mass spectrometer 8. In this manner, the secondary ion mass spectrometry for a portion on the specimen positioned (or located) with high precision can be effected.

In the foregoing embodiment, the deflection electrode 5 for making the irradiation positions of ion beam and electron beam on the specimen coincident with each other has been provided separately from the deflection electrode 4 for scan of charged particle beam. Alternatively, a single deflection electrode may be used to which deflection signals necessary for scan of charged particle beam and for coincidence of the irradiation positions of ion beam and electron beam are applied in a superimposed form. Also, though in the foregoing embodiment an electrostatic deflector has been used as each of the deflector for scan of charged particle beam and the deflector for coincidence of the irradiation positions of ion beam and electron beam, these deflectors may be magnetic deflectors or the combination of an electrostatic deflector and a magnetic deflector so long as the deflectors have functions which are intended here.

In the foregoing embodiment, the image of a specimen surface has been obtained by detecting secondary charged particles (secondary ions or secondary electrons). Alternatively, the specimen surface image can be obtained by detecting a reflected version of or an absorption current of primary charged particles (primary ions or primary electrons).

Though in the foregoing embodiment the ion beam 15 and the electron beam 16 have been extracted from the same charged particle beam source 1, the ion beam and the electron beam may be extracted from separate charged particle beam sources. Further, though in the foregoing embodiment a method of preliminarily marking a characteristic point in an image by means of cursors in order to make the irradiation positions of ion beam and electron beam coincident with each other has been used, more precise positioning (or location) can be easily made by using an image memory. Furthermore, though the foregoing embodiment has been explained in conjunction with the example in which the present invention is applied to the secondary ion mass spectrometry, the present invention is applicable to an ion beam micro fabrication tool or an ion implantor.

As is apparent from the foregoing detailed explanation, according to the present invention, it is possible to easily make the irradiation positions of an ion beam and an electron beam on a specimen coincident with each other.

We claim:

1. A charged particle beam apparatus comprising:
   charged particle beam generating means for generating an ion beam and an electron beam as charged particle beams;
   a focusing lens system for finely focusing the generated charged particle beam;
   a charged particle beam deflecting system for deflecting the focused charged particle beam;
   a specimen subjected to irradiation thereof with the charged particle beam;
   confirming means for confirming the deviation of the irradiation positions of the ion beam and the electron beam on the specimen from each other; and
   coincidence means for making the irradiation positions of the ion beam and the electron beam on the specimen coincident with each other.

2. A charged particle beam apparatus according to claim 1, wherein said confirming means includes means for comparatively observing a secondary particle image of a surface of the specimen by irradiation with the ion beam and a secondary charged particle image of the specimen surface by irradiation of the electron beam which are obtained by scanning the specimen with each of the ion beam and the electron beam and detecting secondary particles emitted from the specimen, and said coincidence means includes means for adjusting said charged particle beam deflecting system so that a first characteristic point in the secondary charged particle image by irradiation with one of the ion beam and the electron beam coincides on a display screen with a second characteristic point in the secondary charged particle image by irradiation with the other of the ion beam and the electron beam corresponding to said first characteristic point.

3. A charged particle beam apparatus according to claim 1, wherein said charged particle beam deflecting system includes an electrostatic deflector and a power supply for said electrostatic deflector, and said coincidence means includes means for setting a deflection voltage applied to said electrostatic deflector to different values upon irradiation with the ion beam and upon irradiation with the electron beam, respectively.

4. A charged particle beam apparatus according to claim 1, wherein said charged particle beam deflecting system includes a deflector for DC-wise deflecting the charged particle beam and a deflector for scanning the charged particle beam.

5. A charged particle beam apparatus according to claim 1, wherein said charged particle beam deflecting system includes an electrostatic deflector and a power supply for said electrostatic deflector, and said coincidence means includes means for automatically changing over a deflection voltage applied to said electrostatic deflector interlocking with a change-over of an acceleration voltage upon irradiation with the ion beam and upon irradiation with the electron beam.

* * * * *